US008623720B2

(12) United States Patent
Yoon et al.

(10) Patent No.: US 8,623,720 B2
(45) Date of Patent: Jan. 7, 2014

(54) METHOD OF FABRICATING A THIN FILM TRANSISTOR FROM AMORPHOUS SILICON AND ORGANIC LIGHT EMITTING DIODE DISPLAY DEVICE HAVING THE THIN FILM TRANSISTOR

(75) Inventors: Joo-Chul Yoon, Yongin (KR); Oh-Seob Kwon, Yongin (KR); Yong-Soo Lee, Yongin (KR); Su-Bin Song, Yongin (KR); Joo-Hwa Lee, Yongin (KR); Byoung-Keon Park, Yongin (KR); Tae-Hoon Yang, Yongin (KR); Jin-Wook Seo, Yongin (KR); Ki-Yong Lee, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/464,697

(22) Filed: May 4, 2012

(65) Prior Publication Data
US 2012/0220085 A1 Aug. 30, 2012

Related U.S. Application Data (62) Division of application No. 12/641,948, filed on Dec. 18, 2009, now Pat. No. 8,198,634.

(30) Foreign Application Priority Data

Dec. 18, 2008 (KR) ........................ 10-2008-0129327

(51) Int. Cl.
 *H01L 21/84* (2006.01)
(52) U.S. Cl.
 USPC .................................... 438/166; 257/E21.413
(58) Field of Classification Search
 USPC ........... 438/166, 149, 58, 143, 310, 402, 471, 438/509, 522, 530
 See application file for complete search history.

(56) References Cited

U.S. PATENT DOCUMENTS 6,197,626 B1 3/2001 Yamazaki et al.
6,271,541 B2 8/2001 Yamaguchi et al.
(Continued)

FOREIGN PATENT DOCUMENTS

JP 2001-035885 2/2001
JP 2001-135573 5/2001
(Continued)

OTHER PUBLICATIONS

Non-Final Office Action dated Aug. 3, 2011 for U.S. Appl. No. 12/641,948.

(Continued)

*Primary Examiner* — Evan Pert
*Assistant Examiner* — Selim Ahmed
(74) *Attorney, Agent, or Firm* — H.C. Park & Associates, PLC (57) ABSTRACT

A thin film transistor (TFT), a method of fabricating the same, and an organic light emitting diode (OLED) display device including the TFT. The TFT includes a substrate having a pixel region and a non-pixel region, a semiconductor layer, a gate insulating layer, a gate electrode, and source and drain electrodes disposed on the pixel region, at least one gettering site disposed on the non-pixel region, and at least one connection portion to connect the at least one gettering site and the semiconductor layer. The method of fabricating the TFT includes patterning a polycrystalline silicon (poly-Si) layer to form a plurality of semiconductor layers, connection portions, and at least one gettering site, the semiconductor layers being connected to the at least one gettering site via the connection portions, and annealing the substrate to getter the plurality of semiconductor layers.

6 Claims, 6 Drawing Sheets

(56) References Cited

U.S. PATENT DOCUMENTS

| | | |
|---|---|---|
| 6,436,745 B1 | 8/2002 | Gotou et al. |
| 6,998,641 B2 | 2/2006 | Makita et al. |
| 2003/0025158 A1* | 2/2003 | Makita et al. ............ 257/347 |
| 2005/0285516 A1 | 12/2005 | Godo et al. |
| 2006/0289934 A1* | 12/2006 | Tanabe et al. ............ 257/347 |

FOREIGN PATENT DOCUMENTS

| | | |
|---|---|---|
| JP | 2003-303831 | 10/2003 |
| JP | 2005-197526 | 7/2005 |
| JP | 2006-303218 | 11/2006 |
| KR | 2001-14961 | 2/2001 |
| KR | 2003-3043 | 1/2003 |
| KR | 1020050088588 | 9/2005 |
| KR | 2006-86811 | 8/2006 |

OTHER PUBLICATIONS

Final Office Action dated Jan. 6, 2012 for U.S. Appl. No. 12/641,948.
Notice of Allowance dated Apr. 13, 2012 for U.S. Appl. No. 12/641,948.

* cited by examiner

METHOD OF FABRICATING A THIN FILM TRANSISTOR FROM AMORPHOUS SILICON AND ORGANIC LIGHT EMITTING DIODE DISPLAY DEVICE HAVING THE THIN FILM TRANSISTOR

CROSS-REFERENCE TO RELATED APPLICATIONS

This application is a divisional of U.S. patent application Ser. No. 12/641,948, filed on Dec. 18, 2009, and claims priority from and the benefit of Korean Patent Application No. 10-2008-0129327, filed on Dec. 18, 2008, all of which are hereby incorporated by reference for all purposes as if fully set forth herein.

BACKGROUND OF THE INVENTION

1. Field of the Invention

Aspects of the present invention relate to an organic light emitting diode (OLED) display device and a method of fabricating the same and, more particularly, to an OLED display device, and a method of fabricating the same, in which a metal catalyst remaining in a channel region of a semiconductor layer crystallized using the metal catalyst is gettered so that the amount of metal catalyst remaining in the semiconductor layer is reduced so as to improve the electrical properties of the OLED display device.

2. Description of the Related Art

In general, a polycrystalline silicon (poly-Si) layer is widely used as a semiconductor layer for a thin film transistor (TFT) because the poly-Si layer has high field-effect mobility, is applicable to a high-speed operating circuit, and may be used to configure a complementary-metal-oxide-semiconductor (CMOS) circuit. A TFT using the poly-Si layer typically functions as an active device of an active-matrix liquid crystal display (AMLCD) or a switching device or a driving device of an organic light emitting diode (OLED).

Methods of crystallization of an amorphous silicon (a-Si) layer into a poly-Si layer include a solid phase crystallization (SPC) method, an excimer laser annealing (ELA) method, a metal induced crystallization (MIC) method, and a metal induced lateral crystallization (MILC) method. Specifically, the SPC method includes annealing an a-Si layer for several to several tens of hours at temperatures below about 700° C. as a glass substrate for a display device using a TFT is deformed at temperatures above about 700° C. The ELA method includes partially heating an a-Si layer to a high temperature in a short amount of time by irradiating excimer laser beams to the a-Si layer. The MIC method includes bringing a metal, such as nickel (Ni), palladium (Pd), gold (Au), or aluminum (Al), into contact with an a-Si layer or injecting the metal into the a-Si layer to induce phase transition from the a-Si layer to a poly-Si layer. Also, the MILC method includes sequentially inducing the crystallization of an a-Si layer while laterally diffusing silicide formed by reaction of the metal with the silicon.

However, since the SPC method involves annealing a substrate at a high temperature for a long period of time, great damage may occur to the substrate. Also, the ELA method not only requires expensive laser apparatuses but also causes protrusions on the surface of the poly-Si layer so as to degrade interface characteristics between a semiconductor layer and a gate insulating layer. Furthermore, according to the MIC or MILC method, a large amount of metal catalyst may remain in a poly-Si layer, thereby increasing the leakage current of a semiconductor layer of a TFT.

Nowadays, a vast amount of research is being conducted on methods of crystallizing an a-Si layer using a metal catalyst because the a-Si layer may be crystallized at a lower temperature for a shorter amount of time than in the SPC method. Typical methods of crystallizing an a-Si layer using a metal catalyst include an MIC method, an MILC method, and a super grain silicon (SGS) method. In these methods, however, the device characteristics of a TFT may be degraded due to contamination caused by the metal catalyst.

In order to prevent contamination caused by a metal catalyst, after an a-Si layer is crystallized using the metal catalyst, a gettering process may be performed to remove the remaining metal catalyst. Conventionally, the gettering process is performed using impurities, such as phosphorus (P) gas or a noble gas, or by forming an a-Si layer on a poly-Si layer. However, in the conventional methods, the metal catalyst is not effectively removed from the poly-Si layer, and a problematic leakage current still remains.

SUMMARY OF THE INVENTION

Aspects of the present invention provide a thin film transistor (TFT), a method of fabricating the same, and an organic light emitting diode (OLED) display device having the TFT, in which a metal catalyst remaining in a channel region of a semiconductor layer that is crystallized using the metal catalyst is gettered so that the amount of metal catalyst remaining in the channel region of the semiconductor layer can be reduced to improve the electrical properties of the TFT.

According to an aspect of the present invention, a TFT includes: a substrate having a pixel region and a non-pixel region; a semiconductor layer, a gate insulating layer, a gate electrode, and source and drain electrodes disposed on the pixel region of the substrate; at least one gettering site disposed on the non-pixel region, and at least one connection portion to connect the at least one gettering site and the semiconductor layer.

According to another aspect of the present invention, a method of fabricating a TFT includes: preparing a substrate having a pixel region and a non-pixel region; forming an amorphous silicon (a-Si) layer on the substrate in both the pixel region and the non-pixel region; crystallizing the a-Si layer with a metal catalyst to form a polycrystalline silicon (poly-Si) layer; patterning the poly-Si layer to form a plurality of semiconductor layers, at least one connection portion, and at least one gettering site, the semiconductor layers being connected to the at least one gettering site via the at least one connection portion; annealing the substrate to getter the plurality of semiconductor layers; forming a gate insulating layer on the substrate; and forming gate electrodes on the gate insulating layer corresponding respectively to channel regions of the plurality of semiconductor layers; and forming source and drain electrodes electrically connected to the plurality of semiconductor layers and electrically insulated from the gate electrode.

According to still another aspect of the present invention, an OLED display device includes: a substrate having a pixel region and a non-pixel region; a semiconductor layer, a gate insulating layer, a gate electrode, and source and drain electrodes disposed on the pixel region of the substrate; at least one gettering site disposed on the non-pixel region of the substrate; at least one connection portion to connect the at least one gettering site and the semiconductor layer, and a first electrode, an organic layer, and a second electrode electrically connected to one of the source and drain electrodes, the organic layer being disposed between the first and second electrodes.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The exemplary embodiments are described below in order to explain the aspects of the present invention by referring to the figures.

Moreover, it is to be understood that where it is stated herein that one layer is "formed on" or "disposed on" a second layer, the first layer may be formed or disposed directly on the second layer or there may be intervening layers between the first layer and the second layer. Further, as used herein, the term "formed on" is used with the same meaning as "located on" or "disposed on" and is not meant to be limiting regarding any particular fabrication process.

Figure 1A:
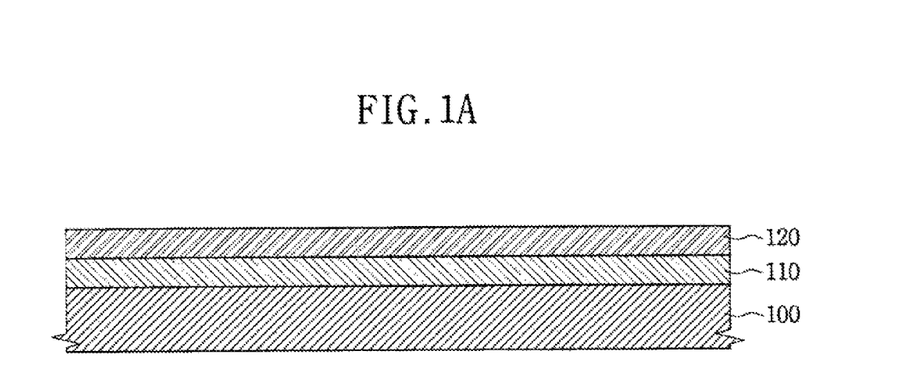
FIGS. 1A through 1D are cross-sectional views illustrating a method of forming a polycrystalline silicon (poly-Si) layer according to an exemplary embodiment.

FIGS. 1A through 1D are cross-sectional views illustrating a method of forming a polycrystalline silicon (poly-Si) layer according to an exemplary embodiment. Referring to FIG. 1A, a buffer layer 110 is formed on a substrate 100, such as a glass substrate or a plastic substrate. The buffer layer 110 may be a single layer or multilayered layer that is formed of an insulating layer, such as a silicon oxide layer or a silicon nitride layer, using a chemical vapor deposition (CVD) process or a physical vapor deposition (PVD) process. In this case, the buffer layer 110 may prevent diffusion of moisture or impurities generated in the substrate 100 or control the transmission rate of heat during a crystallization process, thereby facilitating the crystallization of an amorphous silicon (a-Si) layer.

Thereafter, an a-Si layer 120 is formed on the buffer layer 110. In this case, the a-Si layer 120 may be formed using a CVD process or a PVD process. Also, a dehydrogenation process may be performed during or after the formation of the a-Si layer 120, thereby reducing hydrogen concentration.

The a-Si layer 120 is then crystallized into a poly-Si layer. The crystallization of the a-Si layer 120 into the poly-Si layer may be performed by a crystallization method using a metal catalyst, such as a metal induced crystallization (MIC) method, a metal induced lateral crystallization (MILC) method, or a super grain silicon (SGS) method.

In the SGS crystallization method, a metal catalyst that diffuses into an a-Si layer is controlled to a low concentration such that the size of crystal grains ranges from several to several hundred μm. For example, in order to reduce the concentration of a metal catalyst diffusing into an a-Si layer, the SGS crystallization method may include forming a capping layer on the a-Si layer, forming a metal catalyst layer on the capping layer, and annealing the metal catalyst layer to diffuse the metal catalyst into the a-Si layer. Alternatively, the concentration of a metal catalyst that diffuses into an a-Si layer may be lowered by forming a metal catalyst layer at a low concentration without forming a capping layer.

According to the SGS crystallization method using a capping layer, the concentration of a metal catalyst that diffuses into an a-Si layer may be controlled more effectively than in the MIC or MILC method. Thus, the SGS crystallization method will now be described.

Figure 1B:
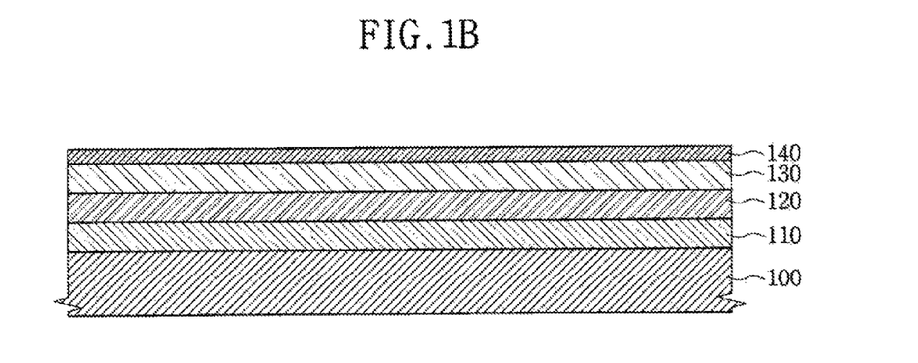

FIG. 1B is a cross-sectional view illustrating a process of forming a capping layer and a metal catalyst layer on the a-Si layer. Referring to FIG. 1B, a capping layer 130 is formed on the a-Si layer 120. The capping layer 130 may be a silicon nitride layer into which a metal catalyst may diffuse during a subsequent annealing process or a double layer of a silicon nitride layer and a silicon oxide layer. The capping layer 130 may be formed using a CVD technique or a PVD technique. The capping layer 130 may be formed to a thickness of about 1 to 2000 Å. When the capping layer 130 is formed to a thickness of less than 1 Å, the capping layer 130 may not properly function to control the amount of metal catalyst that diffuses into the a-Si layer 120. When the capping layer 130 is formed to a thickness of more than 2000 Å, only a small amount of metal catalyst may diffuse into the a-Si layer 120, thereby resulting in incomplete crystallization of the a-Si layer 120.

Thereafter, a metal catalyst is deposited on the capping layer 130, thereby forming a metal catalyst layer 140. The metal catalyst may be one selected from the group consisting of nickel (Ni), palladium (Pd), silver (Ag), gold (Au), aluminum (Al), tin (Sn), antimony (Sb), copper (Cu), terbium (Tb), and cadmium (Cd). For example, the metal catalyst may be Ni. In this case, the metal catalyst layer 140 may be formed to an areal density of about $10^{11}$ to $10^{15}$ atoms/cm$^2$ on the capping layer 130. When the metal catalyst layer 140 is formed to an areal density lower than about $10^{11}$ atoms/cm$^2$, only a small number of seeds of crystallization may be formed, thereby precluding crystallization of the a-Si layer 120 into a poly-Si layer. When the metal catalyst layer 140 is formed to an areal density of more than about $10^{15}$ atoms/cm$^2$, the amount of metal catalyst diffusing into the a-Si layer 120 may be increased, thereby reducing the size of crystal grains of the poly-Si layer. Also, when the metal catalyst layer 140 is formed to an areal density of more than about $10^{15}$ atoms/cm$^2$, the remaining amount of metal catalyst after gettering may be increased, degrading the characteristics of a resultant semiconductor layer formed by patterning the poly-Si layer.

Figure 1C:
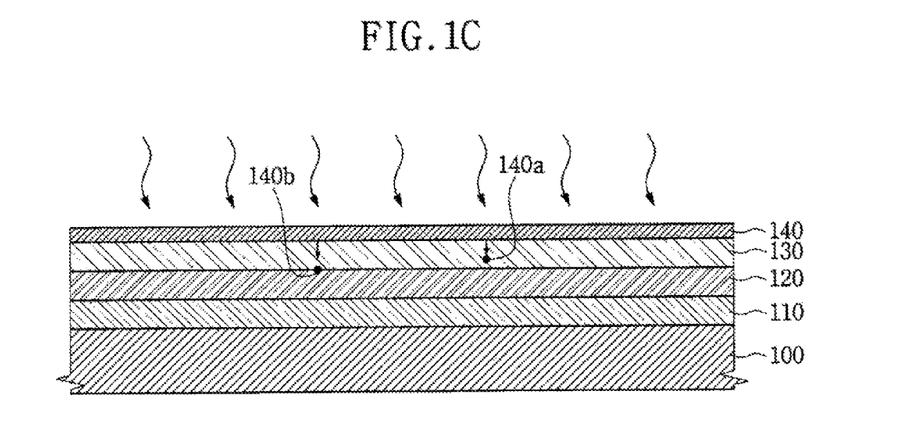

FIG. 1C is a cross-sectional view illustrating a process of annealing the substrate to diffuse the metal catalyst through the capping layer into the a-Si layer. Referring to FIG. 1C, the substrate 100 having the buffer layer 110, the a-Si layer 120, the capping layer 130, and the metal catalyst layer 140 disposed thereon is annealed so that part of the metal catalyst of the metal catalyst layer 140 may move to the surface of the a-Si layer 120. Specifically, only a small amount of metal catalyst 140b out of metal catalysts 140a and 140b diffusing through the capping layer 130 from the metal catalyst layer 140 diffuses into the surface of the a-Si layer 120, while a large amount of metal catalyst 140a may neither reach the a-Si layer 120 nor pass through the capping layer 130.

Thus, the amount of metal catalyst diffused to the surface of the a-Si layer 120 may depend on the diffusion barrier capability of the capping layer 130, which is related to the thickness of the capping layer 130. In other words, as the thickness of the capping layer 130 increases, the diffused amount of metal catalyst from the metal catalyst layer 140 decreases and the size of crystal grains increases. Conversely, as the thickness of the capping layer 130 decreases, the diffused amount of metal catalyst from the metal catalyst layer 140 increases and the size of the crystal grains decreases.

In this case, the annealing process for diffusing the metal catalyst from the metal catalyst layer 140 may be performed at a temperature of about 200 to 900° C., for example, about 350 to 500° C., for several seconds to several hours. When the annealing process is performed under the above-described time and temperature conditions, the deformation of the substrate 100 due to overheating may be prevented, and desired results may be expected in terms of fabrication cost and yield. The annealing process may be performed using any one of a furnace process, a rapid thermal annealing (RTA) process, an ultraviolet (UV) process, and a laser process.

Figure 1D:
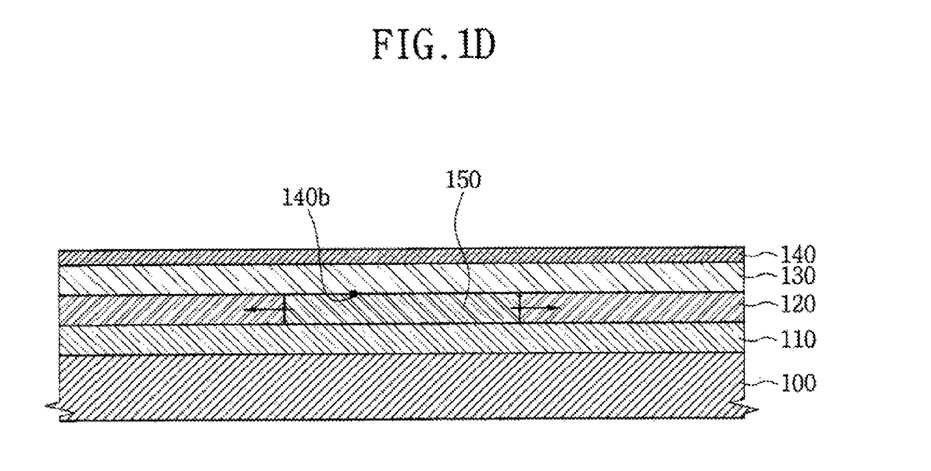

FIG. 1D is a cross-sectional view illustrating a process of crystallizing the a-Si layer into a poly-Si layer using the diffused metal catalyst. Referring to FIG. 1D, due to the metal catalyst 140b that passes from the metal catalyst layer 140 through the capping layer 130 and diffuses at least to the surface of the a-Si layer 120, the a-Si layer 120 may be crystallized into a poly-Si layer 150. That is, the diffused metal catalyst 140b may combine with Si of the a-Si layer 120 to form a metal silicide. Thus, the metal silicide may form crystal nuclei (i.e., seeds), thereby crystallizing the a-Si layer 120 into the poly-Si layer 150.

Although it is illustrated in FIG. 1D that the annealing process is performed on the resultant structure having the capping layer 130 and the metal catalyst layer 140, after the metal catalyst is diffused into the surface of the a-Si layer 120 to form the metal silicide, the capping layer 130 and the metal catalyst layer 140 may be removed before the annealing process for forming the poly-Si layer 150.

Figure 2A:
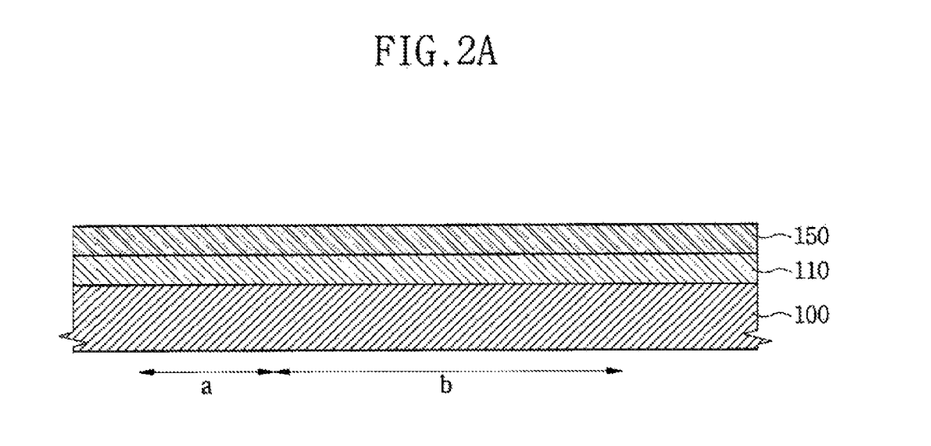
FIGS. 2A through 2D are cross-sectional views illustrating a method of forming a thin film transistor (TFT) according to an exemplary embodiment.
Figure 2B:
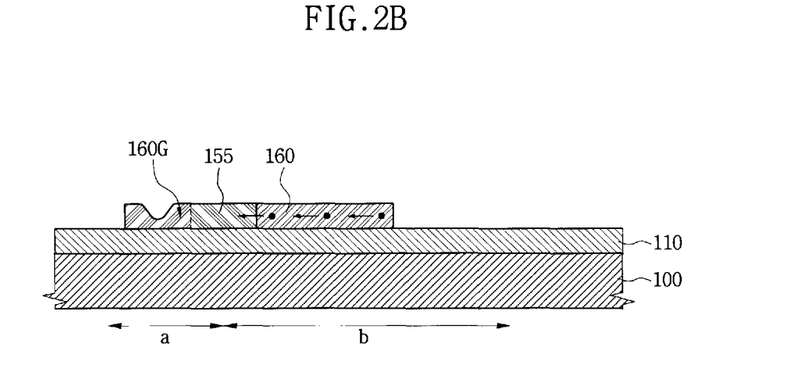

FIGS. 2A through 2D are cross-sectional views illustrating a method of forming a thin film transistor (TFT) according to an exemplary embodiment. Referring to FIGS. 2A and 2B, the capping layer (refer to 130 in FIG. 1D) and the metal catalyst layer (refer to 140 in FIG. 1D) are removed from the substrate 100 having the poly-Si layer 150, so that the substrate 100 having the poly-Si layer 150, which includes a non-pixel region "a" and a pixel region "b", may be prepared.

Thereafter, the poly-Si layer 150 may be patterned. In this case, the poly-Si layer 150 is patterned to connect a plurality of semiconductor layers 160 and a gettering site 160G via a connection portion 155 disposed to connect the semiconductor layers 160 and the gettering site 160G such that the connection portion 155 crosses between the non-pixel region "a" and the pixel region "b". Each of the plurality of semiconductor layers 160 may be connected to a plurality of gettering sites 160G or to respective gettering sites 160G. Here, the gettering site 160G may include a plurality of holes, grooves, indentations, and/or pits. In other words, the semiconductor layers 160 and the gettering site(s) 160G may be connected by the connection portions 155 formed of the poly-Si layer 150. Also, the poly-Si layer 150 may be patterned such that the semiconductor layer 160 is located in the pixel region "b", while the gettering site 160G is located in the non-pixel region "a". A data line (not shown), a scan line (not shown), and a common power supply line (not shown) may also be located in the non-pixel region "a".

Afterwards, a gettering process may be performed on the semiconductor layer 160. The holes of the gettering site 160G may be further doped with n-type or p-type impurities. The n-type impurities may be ions of phosphorus (P), while the p-type impurities may be ions of boron (B). Alternatively, a damage region may be formed using ions or plasma in a region of the semiconductor layer 160, which contacts a metal layer or metal silicide layer, thereby enhancing a gettering effect. Alternatively, a metal layer formed of a metal other than the metal catalyst, a metal silicide layer formed of a silicide of the metal other than the metal catalyst, or a double layer thereof, may be formed.

After the gettering site 160G is prepared as described above, the gettering site 160G may be annealed at a temperature of about 500 to 993° C. for 10 seconds to 10 hours. When the annealing process is performed at a temperature below 500° C., the diffusion of the metal catalyst does not occur in the semiconductor layer 160 and the metal catalyst may not move to the gettering site 160G. Also, the annealing process may be performed at a temperature of about 993° C. or lower because Ni for the metal catalyst may remain solid at a temperature above a temperature of 993° C., which is the eutectic point of Ni.

When the annealing process is performed for a shorter time than 10 seconds, it may be difficult to sufficiently remove the remaining metal catalyst from the semiconductor layer 160. When the annealing process is performed for a longer time than 10 hours, the substrate 100 may be deformed due to the long-duration of the annealing process, and problems may be caused in terms of fabrication cost and yield. Meanwhile, when the annealing process is performed at a relatively high temperature, it is possible to remove the metal catalyst in a relatively short amount of time.

Referring to FIG. 2B, after the above-described gettering process, the semiconductor layer 160 remains connected to the gettering site 160G by the connection portion 155. Since the metal catalyst is gettered from the semiconductor layer 160 into the gettering site 160G, the concentration of the metal catalyst may be higher in the gettering site 160G than in the semiconductor layer 160.

Although FIG. 2B illustrates only one gettering site that is connected to the semiconductor layer 160; however, a plurality of gettering sites 160G may be further connected to the semiconductor layer 160.

Figure 2C:
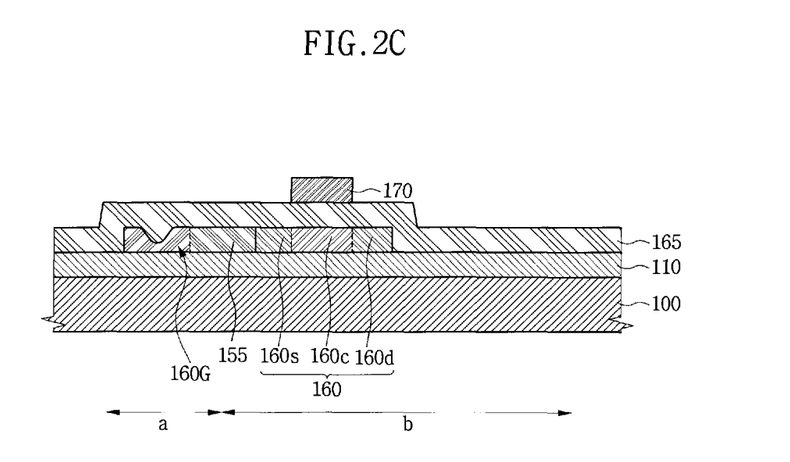

Referring to FIG. 2C, a gate insulating layer 165 is formed on the entire surface of the substrate 100 covering the semiconductor layer 160, the connection portion 155, and the gettering site 160G. The gate insulating layer 165 may be a silicon oxide layer, a silicon nitride layer, or a double layer thereof. Further, the gate insulating layer 165 need not be formed to cover the entire substrate 100 but may only cover a portion of the semiconductor layer 160 sufficient to insulate the semiconductor layer 160 from a later formed gate electrode 170.

Thereafter, a gate electrode 170 may be formed on the gate insulating layer 165. In this case, the gate electrode 170 may be formed to correspond to or be disposed on the gate insulating layer 165 above the channel region 160c of the semiconductor layer 160, in which source and drain regions 160s and 160d and the channel region 160c are formed. The gate electrode 170 may be formed of a single layer formed of aluminum (Al) or an Al alloy, such as aluminum-neodymium (Al—Nd), or a double layer obtained by stacking an Al alloy layer on a chromium (Cr) alloy layer or molybdenum (Mo) alloy layer.

Figure 2D:
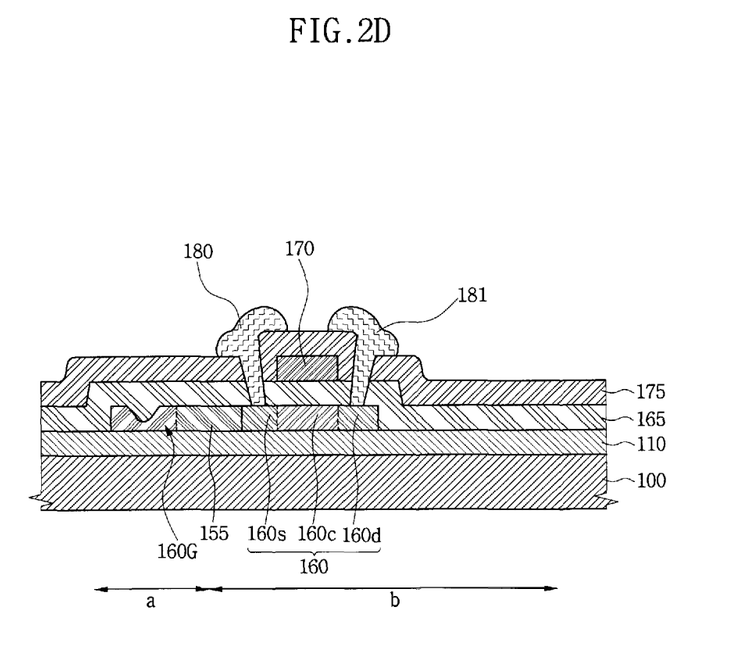

Referring to FIG. 2D, an interlayer insulating layer 175 is formed on the entire surface of the substrate 100, and source and drain electrodes 180 and 181 are formed on the interlayer insulating layer 175 and are connected to the source and drain regions 160s and 160d of the semiconductor layer 170. Here, the interlayer insulating layer 175 may be a silicon nitride layer, a silicon oxide layer, or a double layer thereof. Also, the source and drain electrodes 180 and 181 may be formed of one selected from the group consisting of molybdenum (Mo), chromium (Cr), tungsten (W), molybdenum-tungsten (MoW), aluminum (Al), aluminum-neodymium (Al—Nd), titanium (Ti), titanium nitride (TiN), copper (Cu), a Mo alloy, an Al alloy, and a copper (Cu) alloy. As a result, the fabrication of the TFT according to the aspects of the present invention is completed.

Figure 3:
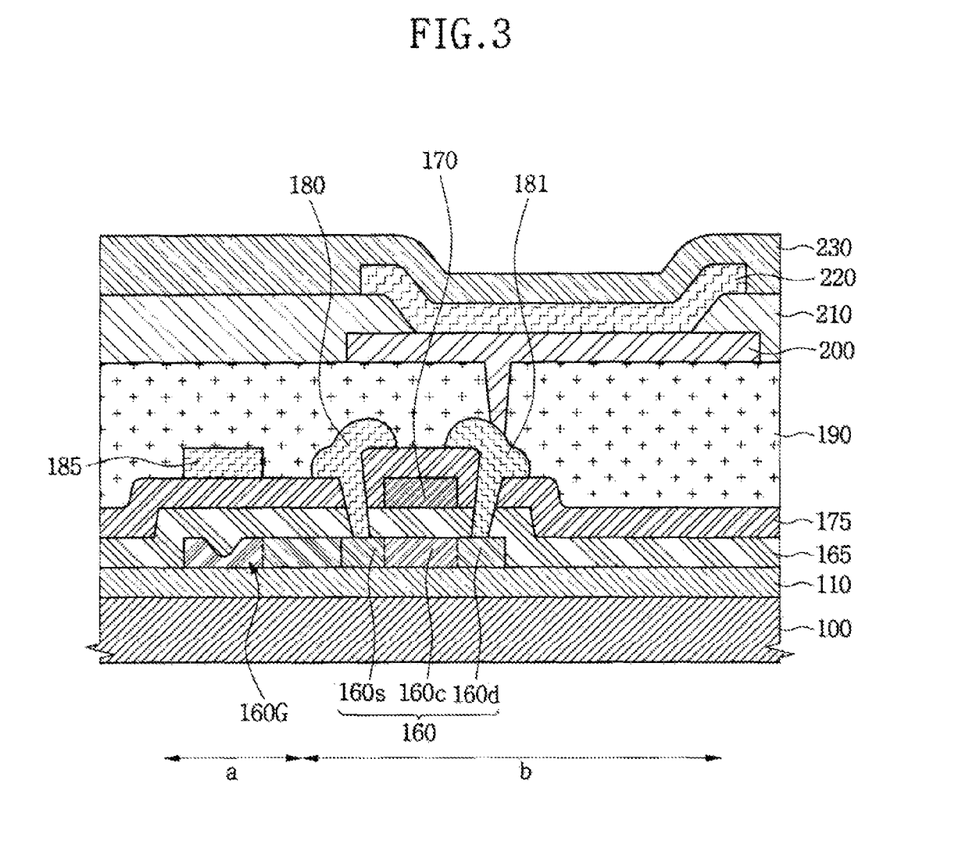
FIG. 3 is a cross-sectional view of an organic light emitting diode (OLED) display device according to an exemplary embodiment.

FIG. 3 is a cross-sectional view of an organic light emitting diode (OLED) display device including a TFT according to an exemplary embodiment. Referring to FIG. 3, the substrate 100 having the source and drain electrodes 180 and 181 has been prepared. In this case, a data line 185 may be formed in the non-pixel region "a" during the formation of the source and drain electrodes 180 and 181. As such, the data line 185 may be formed of the same materials as or materials different from those as from which the source and drain electrodes 180 and 181 are formed.

Thereafter, an insulating layer 190 is formed on the entire surface of the substrate 100 having the source and drain electrodes 180 and 181. The insulating layer 190 may be an inorganic layer, an organic layer, or a stacked layer thereof. The inorganic layer may be one selected from the group consisting of a silicon oxide layer, a silicon nitride layer, or a spin-on-glass (SOG) layer. The organic layer may be formed of one selected from the group consisting of polyimide, benzocyclobutene series resin (BCB resin), and acrylate. Further, the insulating layer 190 need not be formed to cover the entire surface of the substrate 100 but only to cover portions necessary for sufficient insulation of the TFT from a layer formed first electrode 200.

The insulating layer 190 may be etched, thereby forming a via hole to expose one of the source and drain electrodes 180 and 181. A first electrode 200 is formed on the insulating layer 190 and connected to one of the source and drain electrodes 180 and 181 through the via hole in the insulating layer 190. The first electrode 200 may be an anode or a cathode. When the first electrode 200 is an anode, the anode may be formed of a transparent conductive material selected from the group consisting of indium tin oxide (ITO), indium zinc oxide (IZO), and indium tin zinc oxide (ITZO). When the first electrode 200 is a cathode, the cathode may be formed of a conductive material selected from the group consisting of magnesium (Mg), calcium (Ca), aluminum (Al), silver (Ag), barium (Ba), and alloys thereof.

Afterwards, a pixel defining layer 210 having an opening may be formed on the first electrode 200 to expose a portion of the first electrode 200 through the opening. An organic layer 220 having at least an emission layer (EML) may then be formed on the exposed portion of the first electrode 200. The organic layer 220 may further include at least one selected from the group consisting of a hole injection layer (HIL), a hole transport layer (HTL), a hole blocking layer (HBL), an electron blocking layer (EBL), an electron injection layer (EIL), and an electron transport layer (ETL). Subsequently, a second electrode 230 is formed on the organic layer 220. As a result, the fabrication of the OLED display device according to aspects of the present invention is completed.

Figure 4:
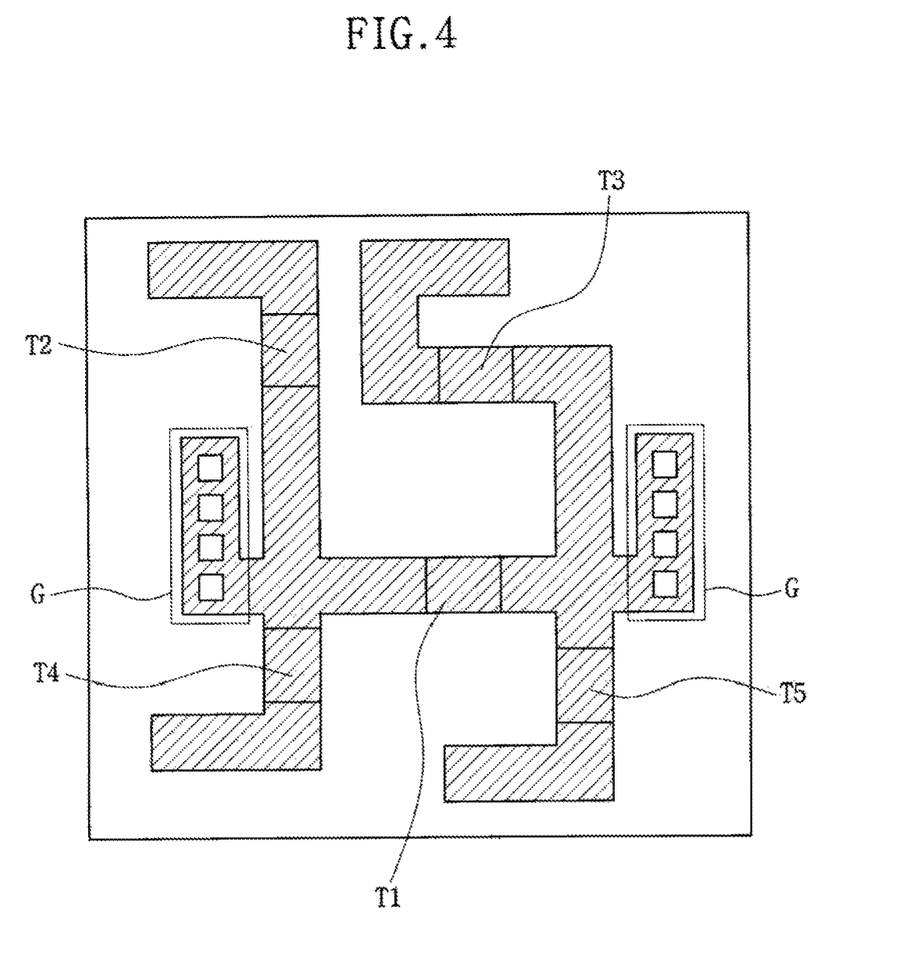
FIG. 4 illustrates a poly-Si layer that is patterned in order to getter a plurality of gettering sites and a plurality of switching TFTs according to an exemplary embodiment.

FIG. 4 illustrates a poly-Si layer that is patterned in order to getter a plurality of gettering sites and a plurality of switching TFTs T1, T2, T3, T4, and T5. Referring to FIG. 4, the poly-Si layer by which the gettering sites G were connected to semiconductor layers of the TFTs T1, T2, T3, T4, and T5 (i.e., the connection portions 155) was gettered at a temperature of about 550° C. for 1 hour.

Table 1 shows results of a comparison of the amounts of metal catalysts remaining in the semiconductor layers of the switching TFTs T1, T2, T3, T4, and T5 after the gettering process.

TABLE 1

| | Amount of metal catalyst (%) | |
|---|---|---|
| | Exemplary embodiments | Comparative examples |
| T1 | 18.5 | 74.3 |
| T2 | 2.3 | 15.0 |
| T3 | 18.8 | 35.9 |
| T4 | 5.4 | 35.4 |
| T5 | 13.7 | 46.1 |

Referring to Table 1, data according to the exemplary embodiments was obtained when, after a plurality of semiconductor layers of switching TFTs were connected and patterned, a plurality of gettering sites were additionally formed and a gettering process was performed using the gettering sites. Conversely, data according to the comparative examples was obtained when a gettering process was performed using internal holes without forming additional gettering sites. As a result, it can be seen that when the gettering sites were additionally formed, the amounts of metal catalysts remaining in the semiconductor layers were markedly reduced.

Although the exemplary embodiments describe only a top-gate TFT in which a gate electrode is disposed over a semiconductor layer, aspects of the present invention may be applied likewise to a bottom-gate TFT in which a gate electrode is disposed under a semiconductor layer.

Aspects of the present invention provide a method of effectively gettering the remaining metal catalyst from a plurality of semiconductor layers by forming external gettering sites so that a leakage current can be reduced and the characteristics of a TFT can be improved.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method of fabricating a thin film transistor (TFT), comprising:
    forming an amorphous silicon (a-Si) layer on both a pixel region and a non-pixel region of a substrate;
    crystallizing the a-Si layer with a metal catalyst to form a polycrystalline silicon (poly-Si) layer;
    patterning the poly-Si layer to form a plurality of semiconductor layers, at least one connection portion, and at least one gettering site, the semiconductor layers being connected to the at least one gettering site via the at least one connection portion;
    annealing the substrate to getter the plurality of semiconductor layers;
    forming a gate insulating layer on the substrate;

forming gate electrodes on the gate insulating layer respectively corresponding to channel regions of the plurality of semiconductor layers; and forming source and drain electrodes electrically connected to the plurality of semiconductor layers and electrically insulated from the gate electrode.

2. The method according to claim 1, wherein the at least one gettering site is formed in the non-pixel region.

3. The method according to claim 1, wherein the semiconductor layers, the gate electrode, and the source and drain electrodes are formed in the pixel region.

4. The method according to claim 1, wherein the metal catalyst includes one selected from the group consisting of nickel (Ni), palladium (Pd), silver (Ag), gold (Au), aluminum (Al), tin (Sn), antimony (Sb), copper (Cu), terbium (Tb), and cadmium (Cd).

5. The method according to claim 1, wherein the annealing is performed at a temperature of about 500 to 993° C. for 10 seconds to 10 hours.

6. The method according to claim 1, wherein the annealing is performed at a temperature at or below the eutectic point of the metal catalyst.

\* \* \* \* \*